(12) United States Patent
Farmer et al.

(10) Patent No.: US 7,240,266 B2
(45) Date of Patent: Jul. 3, 2007

(54) CLOCK CONTROL CIRCUIT FOR TEST THAT FACILITATES AN AT SPEED STRUCTURAL TEST

(75) Inventors: Henry R. Farmer, Colchester, VT (US); Gary D. Grise, Colchester, VT (US); David W. Milton, Underhill, VT (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 10/906,407

(22) Filed: Feb. 18, 2005

(65) Prior Publication Data

US 2006/0190781 A1 Aug. 24, 2006

(51) Int. Cl.
*G01R 31/28* (2006.01)
(52) U.S. Cl. .............. 714/731; 714/727; 714/707; 713/400; 713/500; 326/93; 327/291
(58) Field of Classification Search ...... None
See application file for complete search history.

(56) References Cited

U.S. PATENT DOCUMENTS

| | | | |
|---|---|---|---|
| 5,256,912 A | 10/1993 | Rios | |
| 5,438,601 A | 8/1995 | Maegawa et al. | |
| 5,629,946 A | 5/1997 | Takano | |
| 5,673,271 A | 9/1997 | Ohsawa | |
| 5,809,543 A | 9/1998 | Byers et al. | |
| 6,199,185 B1 | 3/2001 | Ju et al. | |
| 6,223,297 B1 | 4/2001 | Inoue | |
| 6,327,667 B1 | 12/2001 | Hetherington et al. | |
| 6,327,684 B1* | 12/2001 | Nadeau-Dostie et al. | ... 714/731 |
| 6,338,127 B1 | 1/2002 | Manning | |
| 6,404,250 B1 | 6/2002 | Volrath et al. | |
| 6,442,722 B1* | 8/2002 | Nadeau-Dostie et al. | ... 714/731 |
| 6,449,728 B1 | 9/2002 | Bailey | |
| 6,507,230 B1* | 1/2003 | Milton | ...... 327/291 |
| 6,598,192 B1* | 7/2003 | McLaurin et al. | ...... 714/726 |
| 6,724,850 B1 | 4/2004 | Hartwell | |
| 6,877,123 B2* | 4/2005 | Johnston et al. | ...... 714/731 |
| 6,966,021 B2* | 11/2005 | Rajski et al. | ...... 714/726 |
| 7,007,213 B2* | 2/2006 | Wang et al. | ...... 714/729 |
| 2003/0084390 A1* | 5/2003 | Tamarapalli et al. | ...... 714/744 |
| 2004/0163021 A1* | 8/2004 | Nadeau-Dostie | ...... 714/726 |
| 2005/0166104 A1* | 7/2005 | Rich et al. | ...... 714/724 |
| 2005/0240847 A1* | 10/2005 | Nadeau-Dostie et al. | ... 714/726 |
| 2005/0276321 A1* | 12/2005 | Konuk | ...... 375/224 |

* cited by examiner

*Primary Examiner*—Guy Lamarre
*Assistant Examiner*—John P. Trimmings
(74) *Attorney, Agent, or Firm*—W. Riyon Harding

(57) ABSTRACT

When testing an ASIC using functional clocks, a control circuit at the clock root incorporates additional test logic in the root and a deskewer for clock control, giving rise to a very flexible control that can pass clock signals at a number of clock rates and can pass only a single clock edge, thereby permitting the passage of the required number of clock pulses for a test. The system uses the functional clock and the clock distribution tree designed into the ASIC.

37 Claims, 12 Drawing Sheets

Block Diagram of Clock Control Circuit for Test

Overall Block Diagram of Chip Under Test

One Possible Test FSM

Scan Only latches provides final holding value

One possible data suppy using Test FSM as illustrated in FIG.3

Multiplexers for data source selection 210, 220

Low Skew Clock Formatter 300

Parent / Child Domain with Clock Divider

Examining data flow between Parent and Child Domains for an in phase divide by 2

Examining data flow between Parent and Child Domains for an in phase divide by 3

Possible child Clock single edge transitions for testing at speed paths between Parent and Child

FIG. 11

Test Cases by included Clock Generator
type for positive and negative edge latches:

| Case | Phase | Domain direction | Divide type | Sending flipflop | Receiving flipflop | Timing- full cycle or 1/2 cycle path |
|---|---|---|---|---|---|---|
| 1 | IN | SLOW-FAST | EVEN ODD | POSITIVE | POSITIVE | 1.00 |
| 1 | OUT | FAST-SLOW | EVEN ODD | POSITIVE | POSITIVE | 0.50 |
| 2 | OUT | SLOW-FAST | EVEN ODD | POSITIVE | POSITIVE | 0.50 |
| 2 | OUT | SLOW-FAST | EVEN ODD | POSITIVE | NEGATIVE | 1.00 |
| 3 | IN | FAST-SLOW | EVEN ODD | POSITIVE | POSITIVE | 1.00 |
| 3 | IN | FAST-SLOW | EVEN ODD | NEGATIVE | POSITIVE | 0.50 |
| 3 | IN | SLOW-FAST | EVEN ODD | POSITIVE | NEGATIVE | 0.50 |
| 4 | OUT | FAST-SLOW | EVEN ODD | NEGATIVE | POSITIVE | 1.00 |
| 5 | IN | SLOW-FAST | EVEN | NEGATIVE | POSITIVE | 1.00 |
| 5 | OUT | SLOW-FAST | ODD | NEGATIVE | POSITIVE | 1.00 |
| 6 | IN | SLOW-FAST | ODD | NEGATIVE | NEGATIVE | 1.00 |
| 6 | IN | SLOW-FAST | ODD | NEGATIVE | POSITIVE | 0.50 |
| 6 | OUT | SLOW-FAST | EVEN | NEGATIVE | NEGATIVE | 1.00 |
| 6 | OUT | SLOW-FAST | EVEN | NEGATIVE | POSITIVE | 0.50 |
| 7 | IN | FAST-SLOW | EVEN | NEGATIVE | NEGATIVE | 0.50 |
| 7 | IN | FAST-SLOW | EVEN | POSITIVE | NEGATIVE | 1.00 |
| 7 | OUT | FAST-SLOW | EVEN | NEGATIVE | NEGATIVE | 0.50 |
| 7 | OUT | FAST-SLOW | ODD | POSITIVE | NEGATIVE | 1.00 |
| 7 | IN | SLOW-FAST | EVEN | NEGATIVE | NEGATIVE | 0.50 |
| 7 | OUT | SLOW-FAST | ODD | NEGATIVE | NEGATIVE | 0.50 |
| 8 | IN | FAST-SLOW | ODD | NEGATIVE | NEGATIVE | 1.00 |
| 8 | IN | FAST-SLOW | ODD | POSITIVE | NEGATIVE | 0.50 |
| 8 | OUT | FAST-SLOW | EVEN | NEGATIVE | NEGATIVE | 1.00 |
| 8 | OUT | FAST-SLOW | EVEN | POSITIVE | NEGATIVE | 0.50 |

CLOCK CONTROL CIRCUIT FOR TEST THAT FACILITATES AN AT SPEED STRUCTURAL TEST

TECHNICAL FIELD

The field of the invention is that of testing integrated circuits, in particular testing logic circuits structurally using clock signals which are operated at functional speed.

BACKGROUND OF THE INVENTION

In the standard methods of testing ASIC integrated circuits, the circuit contains test structures that supply a scan vector to the operating components, which process that data. The result of the processing of the scan vector is then compared against the expected values to see if the part passes or fails.

In addition to supplying a scan vector of data for the circuit to operate on, the testing setup also supplies a set of clock signals. In various test modes, non-standard clock pulses may be required. The required clock signal may be a short pulse train, a single pulse, a single edge of a clock pulse (rising or falling) or a DC level, high or low.

Integrated circuits often have different clock domains that use clock signals that may differ in phase and/or frequency. The invention enables an at speed structural test of logic using the functional clock. The invention does not depend on a particular scan style such as Mux-Scan or LSSD.

In typical design practices, the components of the clock distribution signals for test clocks are not as fast as the comparable distribution system for functional (those used in normal operation) clocks, so that it is not possible to perform an "at speed" test; i.e. at normal operating speed. Evidently, there may be a problem in a circuit that operates correctly at a reduced test speed, but not at the normal operating speed.

The art could use a flexible system for performing a test at the functional speed. In addition the art could use a flexible system for testing the logic paths between 2 related synchronous clock domains. The invention enables a method of testing such paths.

The art could use a clock control system which does not require at speed timing closure. The invention as illustrated relaxes timing requirements so that at least an additional one half cycle of margin is built in.

SUMMARY OF THE INVENTION

The invention relates to a clock control circuit for at speed structural test (hereafter referred to as the 'Clock Control Circuit for Test') that varies the parameters of a distributed functional clock signal distributed in at least one clock domain in an integrated circuit.

A feature of the invention is that the test control circuit contains both clock control logic for test and functional clock control logic for generating the desired output clock from an input clock in accordance with the test control logic and test enable signal or in accordance with the functional control logic.

A feature of the invention is that the functional clock tree can be used for test at functional speed.

A feature of the invention is that the circuit allows modifying the clock operation under test using the same clock propagation path that is used functionally. Only the data source is changed in going from functional to test mode.

Another feature of the invention is that the output clock frequency can be altered to satisfy the functional requirements of downstream circuits or to satisfy the test requirements. The distributed output clock signal may also be controlled by test logic to be related to the input clock signal by a divide by N relationship. The distributed output clock signal may be controlled by test logic to be a single clock edge.

Another feature of the invention is that the output clock transitions are automatically skew reduced with respect to the incoming clock without needing additional skew control logic.

BRIEF DESCRIPTION OF THE DRAWINGS

FIG. 11 shows in Table 1, the edge in FIG. 9 that would allow testing of inter domain paths for an odd or even divider operating, in phase and out of phase.

DETAILED DESCRIPTION

Figure 1:
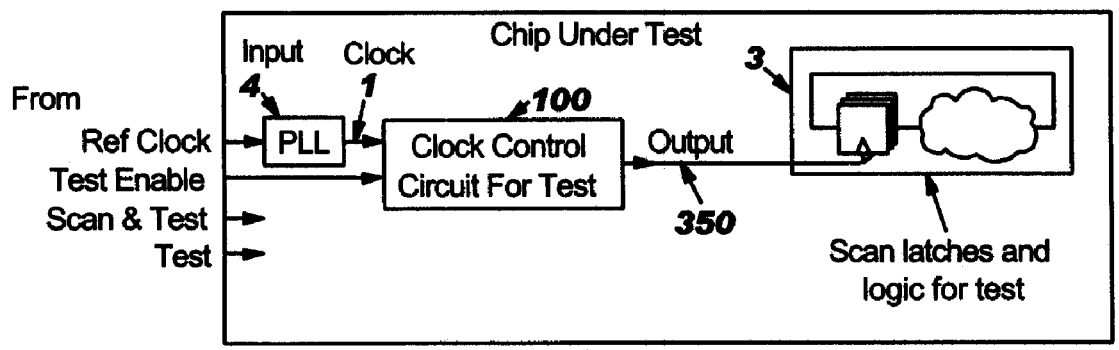
FIG. 1 shows an overall block diagram of an integrated circuit under test.
Figure 1:
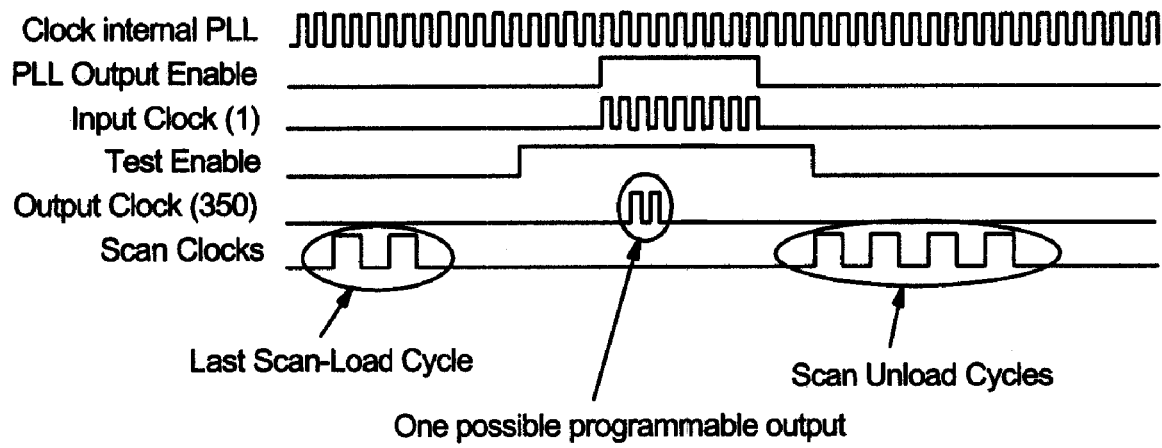

FIG. 1 shows a high-level block diagram of an integrated circuit being tested according to the invention along with applied or generated clocks and controls. Illustratively, the integrated circuit is an ASIC (Application-Specific Integrated Circuit) that has been designed by a customer.

On the right of the Figure, block 3 represents the scan memory elements (memory elements are likely Master Slave Latches) and logic in a clock domain in the ASIC to be tested. This logic receives as an input a clock signal 350. A clock control circuit for test according to the invention that processes the incoming root clock pulse train and generates the pulses or edges required for a particular test, which are supplied on line 350 is illustrated by block 100. Clock Control Circuit for Test (block 100) receives as illustrated an Input Clock (1) from the PLL (4) and a control signal Test Enable. The PLL (block 4) represents a clock source. As illustrated, the PLL receives as an input a reference clock (Ref Clock). The clock source to block 100(Input Clock 1)

could also be brought in directly from off chip. The clock source (PLL) is typically running during test and the internal waveform illustrated by the waveform Clock internal to PLL represents that free running clock. A waveform for a PLL control signal, PLL Output Enable, is shown next, this control allows the free running clock to propagate to the Input Clock (1) after the test vector has been scanned in as shown. The next waveform Test Enable is shown, this control needs to go high prior to the PLL Output Enable to switch the data source for the Clock Control Circuit for Test from a functional source to a test source. The next waveform shows a possible Output Clock (350) based on the test data source. The illustrated output clock waveform is one typically used for an at speed broadside or launch off capture transition test. The last waveform, Scan Clocks illustrates clock waveforms for scanning in test vectors or scanning out of test responses.

In general, a test control circuit according to the invention will be inserted at the output of the PLL and will replace a divide by N structure commonly used in a conventional clock distribution system. If the design does not incorporate a divide by N structure, the test control circuit according to the invention can still be placed at the head of the clock tree to provide the clock control needed for test. In this case the inputs for the functional control could be tied to a stored value.

Figure 2A:
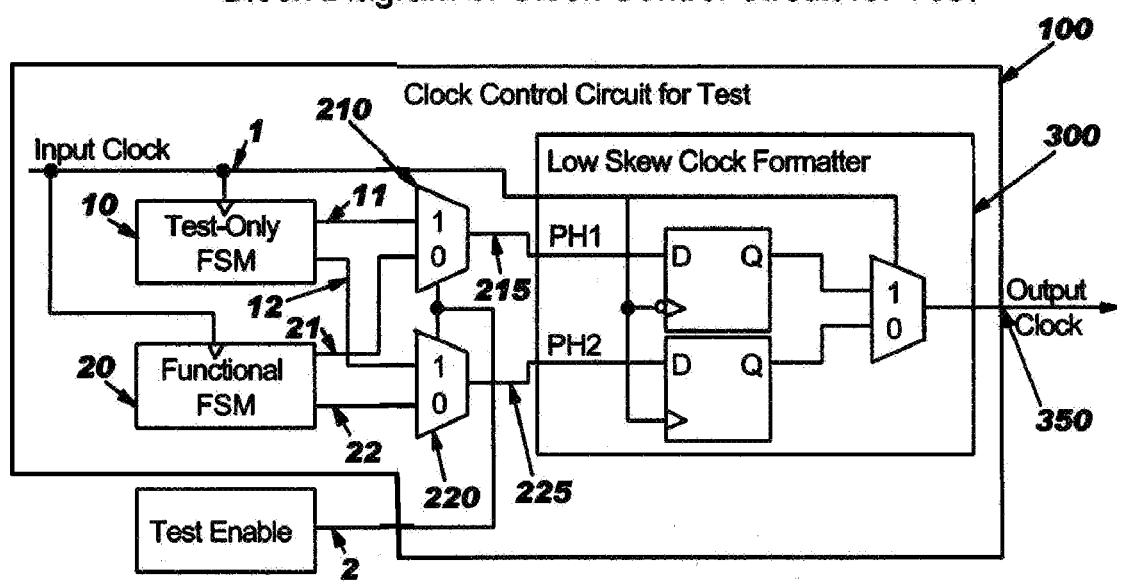
FIG. 2A shows a block diagram of a clock control circuit for test according to the invention.

FIG. 2A illustrates generally an example of a test control circuit 100 that receives as one input a clock root pulse train Input clock on line 1. The Clock Control Circuit for Test 100 also receives additional inputs. These inputs are inputs 11 and 12 from a test only FSM (finite state machine) 10. These inputs provide the data used to control the clock during test. In addition, inputs 21 and 22 are from the functional FSM 20 which provides data to control the clock functionally. Further, a control signal, Test Enable online 2, is used to select which data source is used. For this description of the invention, when Test Enable is high, the Test Only FSM 10 is selected as the data source. However, the logic could be designed to work with either signal polarity. Other inputs such as Scan-in and Scan-out lines are conventional and are not shown for simplicity. The Clock Control Circuit for Test is shown in FIG. 2A to have 2 subcircuits which are multiplexers, 210 and 220, which select a data source and connect it to the internal PH1 and PH2 signals respectively. The Clock Control Circuit for Test also contains a subcircuit 300 which is a low skew clock formatter. The output of the low skew clock formatter 300 provides the output clock 350. This invention uses the same path for the clock (Input Clock 1 and Output Clock 350) when either in functional or test modes. By avoiding inserting additional clock control circuitry for test, additional delays or test inaccuracies are avoided. The Clock Control Circuit for Test also allows flexibility in the form of a clock output for test. Depending on the design of the Test Only FSM, the circuit allows the clock response to be modified under program control after the design is completed and fabricated.

Figure 2B:
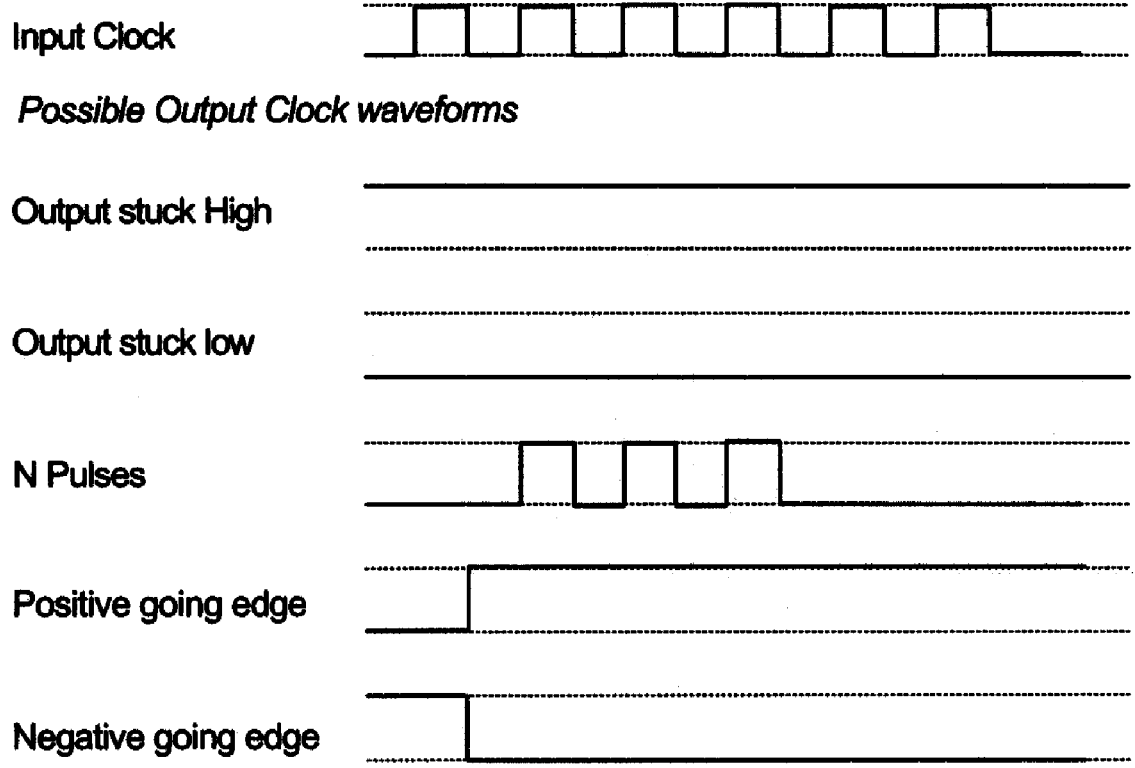
FIG. 2B shows various clock pulses that can be provided by the inventive circuit.

FIG. 2B shows various examples of the clock root input and examples of output clock waveforms such as: a single edge of both polarities, a DC level of output high and a DC level of output low and a set of N pulses. These can be readily generated by the Clock Control Circuit for Test. The range of responses allows for testing of logic paths which would be difficult by other means.

As the examples in FIG. 2B illustrate, the program load data can be programmed to start the output high or low, which allows clocks in domains not tested to be stopped in either state. The system can be programmed to begin high (or low) and propagate n negative (or positive) going pulses. The output clock pulse train can be stopped either high or low. The output can be programmed to pass a single edge, which provides a method to test paths between synchronously related clock domains that operate at different speeds, while avoiding X "don't care" states.

Figure 3:
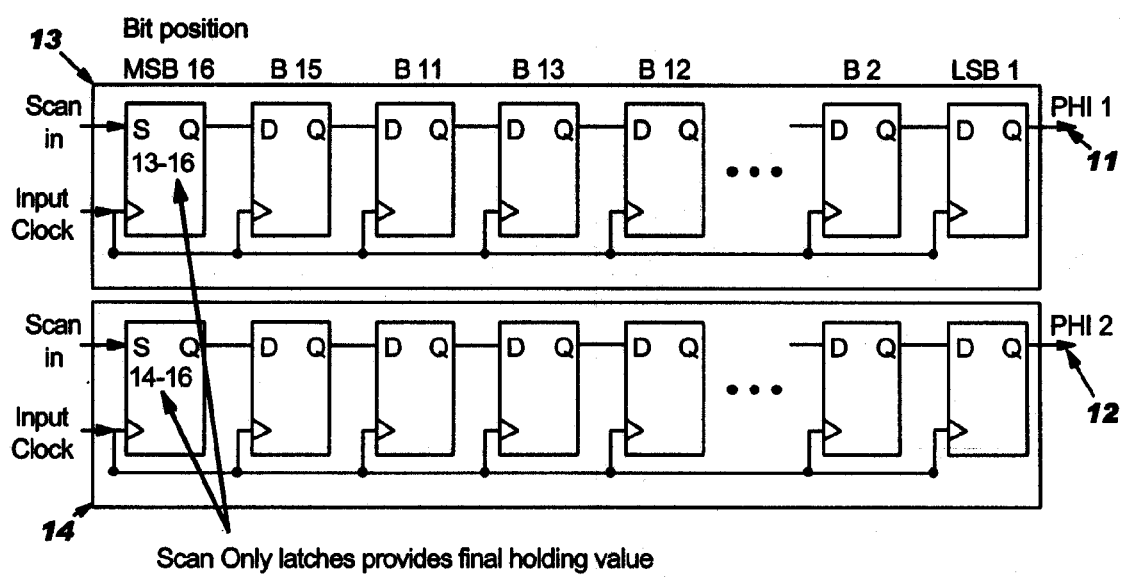
FIG. 3 shows one possible Test FSM (Finite State Machine) circuit (block 100 in FIG. 1) to generate the data portion of the inventive circuit.

FIG. 3 shows one possible implementation of the Test Only FSM subcircuit 10 of FIG. 2A. Finite State Machines are well known in the art and there are many other possible implementations which depend on the design intentions. The FSM illustrated in FIG. 3 consists of two shift registers (13,14) of 16 bits each. Shift registers as illustrated represent the least demanding timing requirement. As the connection from latch to latch is a wire, any logic being tested would have more logic delay in a path and therefore the logic paths are more demanding for timing closure than the shift register. These shift registers are scannable so that in the test mode, a desired response could be programmed. The memory elements on the right side of the shift registers represent the LSB 1 (least significant bit) and are the first values shifted into the CLOCK CONTROL CIRCUIT FOR TEST by the input clock. The values of the shift registers are shifted right and out of the shift register on each positive edge or pulse of the input clock. The Outputs of the shift registers 11 and 12 will be connected to the PH1 and PH2 inputs of the low skew clock formatter (FIG. 2A, subcircuit 300) by the multiplexers 210 and 220 respectively (FIG. 2A subcircuits 210, 220) if the signal Test Enable (signal 2 in FIG. 2A) is high. The memory elements (13–16 and 14–16) representing MSB 16 (most significant bit) are scan only latches that hold their values with each clock transition. Such latches can readily be constructed by feeding back the output into the input or may be special memory elements designed for this purpose. The purpose of the scan only latches is to allow a clock input to begin pulsing and have the programmed clock response flush through the shift registers 13 and 14 and end up holding at a value. This approach to achieve the desired result avoids having to count clock pulses, since the circuit automatically stops responding when 16 shifts have occurred. The shift registers can therefore be programmed to have all '1's in both 13 and 14, which would result in the CLOCK CONTROL CIRCUIT FOR TEST output 350 being forced to a solid '1' state: to have all '0's in both 13 and 14 which would result in the CLOCK CONTROL CIRCUIT FOR TEST output 350 being forced to a solid '0' state; to have all '1's in both 13 and all '0's in 14 which would result in the CLOCK CONTROL CIRCUIT FOR TEST output 350 being forced to in phase divide by 1; to have all '0's in both 13 and all '1's in 14 which would result in the CLOCK CONTROL CIRCUIT FOR TEST output 350 being forced to out of phase divide by 1; to a sequence of pulses consisting of 15 pulses at the input clock frequencies to 1 pulse at a divide by 16 frequency.

If a wider range of clock pulses is desired, more memory elements could be added to the shift registers. The present FSM illustrated by FIG. 3 is 'consumed' during each test so that the values will be reloaded during each scan. Modifications to the circuit illustrated could easily be made which allow programmable looping or adding a shadow memory, as well as other changes depending on design needs.

The flexibility of the CLOCK CONTROL CIRCUIT FOR TEST is also beneficial to the chip designer for functional clock control. The FSM machine approach simplifies the design of complicated clock control. Advantageously, the operation of the clock formatter subcircuit 300 is such that if a customer already has a clock control or clock divider circuit designed that has a single output, this output can be connected to lines 21 and 22 with the resulting output clock on line 350 exhibiting the same response as was applied at the inputs 21 and 22 but with 1 cycle latency. An additional advantage is that the output response has a minimal skew with respect to the input clock without needing additional clock shifting circuitry.

Figure 4:
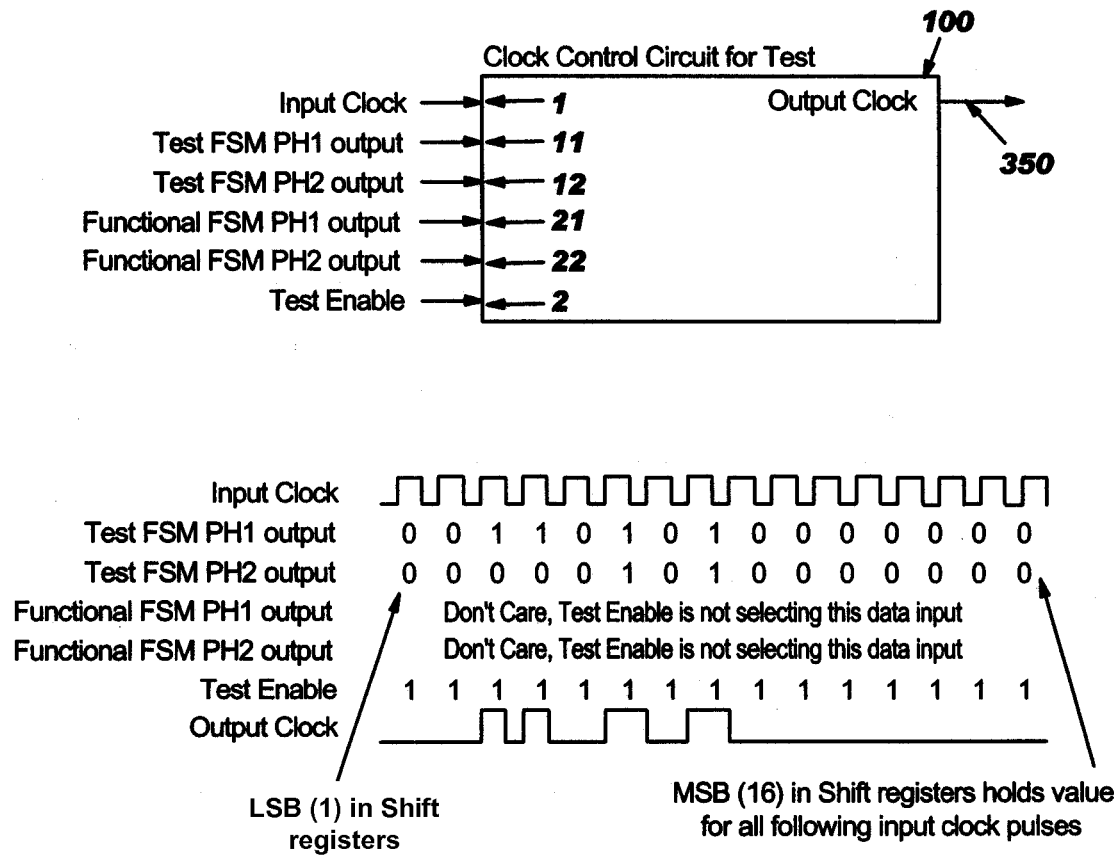
FIG. 4 shows one possible data supply portion of the inventive circuit using the Test FSM described in FIG. 3 to generate the desired output clock response.

FIG. 4 shows a block diagram of the CLOCK CONTROL CIRCUIT FOR TEST along with waveforms illustrating one response to values scanned into the memory elements in the shift registers as shown in FIG. 3. For this illustration the Test Enable signal is shown high which selects the data from the Test Only FSM. Note that in this illustration the LSB data is shown on the left and the MSB on the right which is the opposite order illustrated in FIG. 3.

Figure 5:
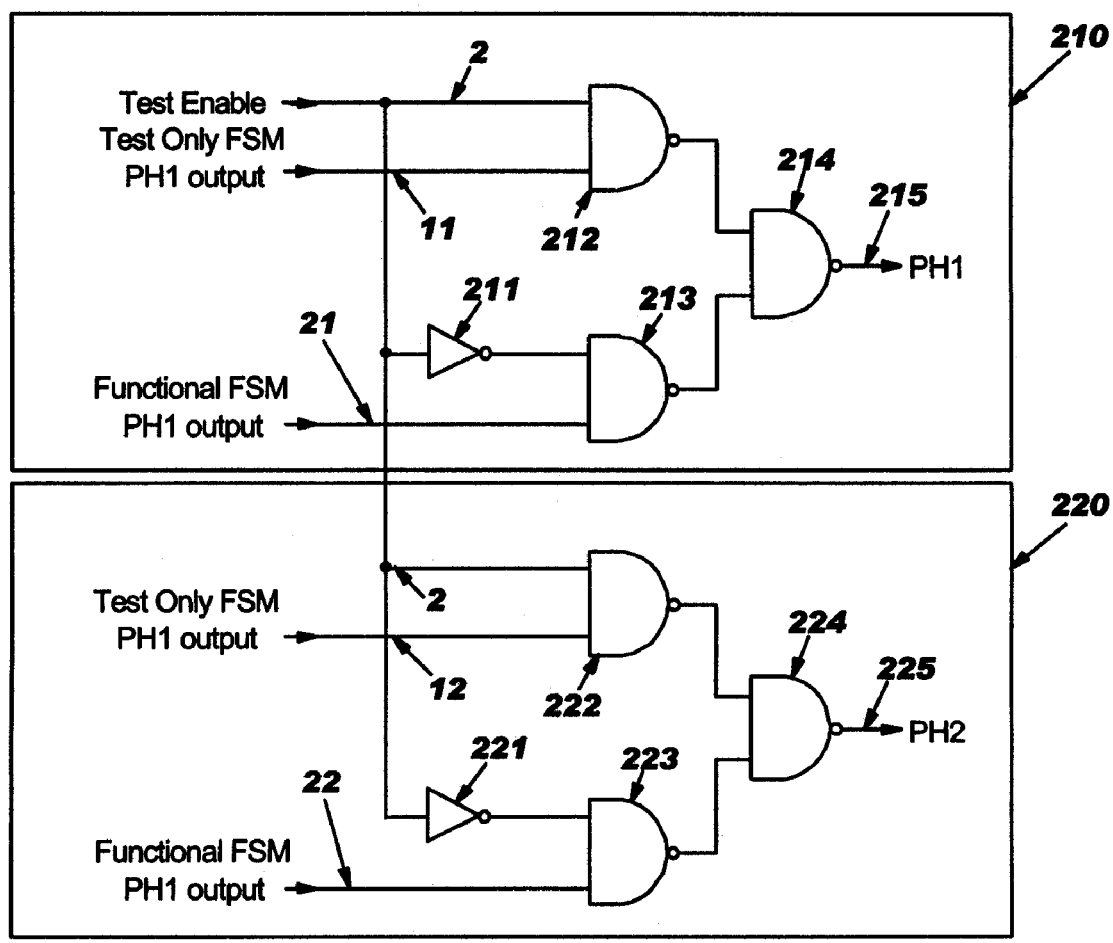
FIG. 5 shows one possible multiplexer circuit for the data source selectors.

FIG. 5 illustrates a logic implementation for the two multiplexers 210 and 220 shown in FIG. 2A. The logic implementation for 210 shown consists of 2 NANDS (212, 213 which either pass line 11 or line 21 depending on the state of Test Enable (line 2). Test Enable (line 20 in inverted by inverter 211 so that when Test Enable is high NAND 212 passes an inverted version of line 11 and NAND 213 output is forced High. If Test Enable is low, then NAND 212 is forced high and NAND 213 passes an inverted version of line 21. NAND 214 takes both outputs of NAND 212 and 213 and removes the inversion from which ever input is switching. The output 215 of NAND 214 provides the input for signal PH1 in the low skew clock formatter (subcircuit 300 in FIG. 2A). The NAND implementation shown is typically the fastest and smallest implementation for CMOS but other implementations are possible. The multiplexer as shown for 220 works in the same manner as 210 but selects between inputs 12 and 22 and connects one of those on output line 225 to the input for signal PH2 in the low skew clock formatter (subcircuit 300 in FIG. 1).

Figure 6:
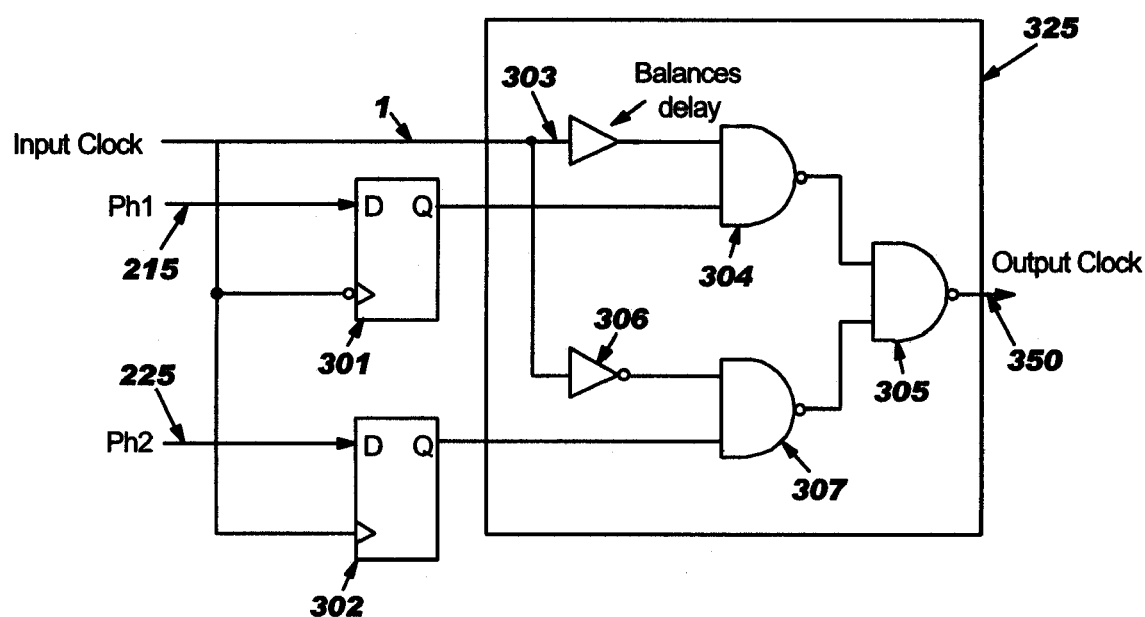
FIG. 6 shows one possible clock formatter circuit which generates the desired clock output based on the data input.

FIG. 6 illustrates a possible logic implementation for the low skew clock formatter as shown by subcircuit 300 in FIG. 1. In FIG. 6, subcircuit 325 is a balanced multiplexer similar in operation as described for multiplexer 210 where the input clock is being used as the selector. Buffer 303 is added to match the delay of inverter 306. When the Input Clock (line 1)is high, the value at the output of memory element 301 is output on line 350. Likewise when the Input Clock is low, the value at the output of memory element 302 is output on line 350. The two memory elements 301 and 302 serve the purpose of latching the values presented at PH1 (215) and PH2 (225) respectively one half cycle earlier than the clock transition which selects that data, reducing the timing requirements. If additional timing relief were needed an additional memory element could be added in front of elements 301 and 302 to accommodate this need. The only skew between the output on line 350 and the clock on line 1 in subcircuit 300 is that from the passage through two NANDs (NAND 304, NAND 305 or NAND 307, NAND 305), which is negligible compared with other skews in prior art clock manipulation circuits. As a result, it is not necessary to delay the clock to preserve clock timing. The circuit can also correct the timing of customer FSMs for derived clocks or customer-generated clocks by feeding the output of the customer FSM 20 to be corrected to the CLOCK CONTROL CIRCUIT FOR TEST. Accordingly, the sub circuit 300 will sometimes be referred to as a deskew circuit.

Figure 7:
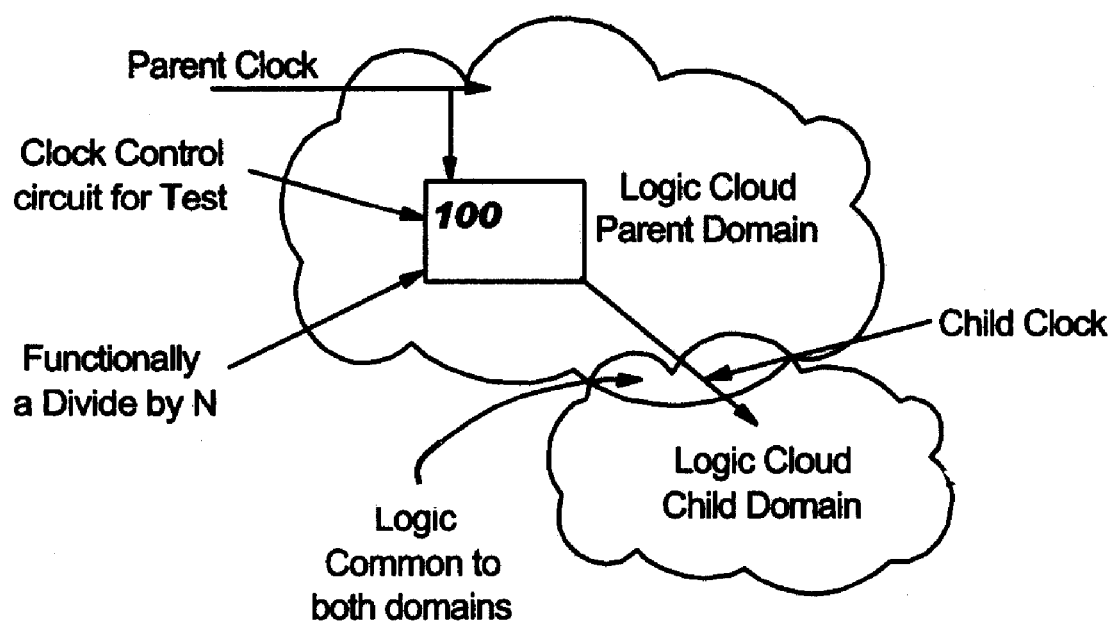
FIG. 7 show the relationship between the root domain (parent domain) and the downstream child domain resulting from a derived clock.

FIG. 7 illustrates a common design practice of adding clock dividers internal to a clock domain. This creates a related synchronous clock domain which is problematic for test. Typically a test in this situation would be to test the faster domain at speed with the clock divider disabled. This tests all the logic paths entirely within in the parent domain but does not test the child domain. Then typically a test clock is multiplexed into the child domain and that domain is tested at the child speed which tests all the paths entirely within the parent domain at speed. However, this does not test those paths between the parent and child domain. An alternative approach would be, after testing the parent domain, slowing down the parent domain clock to the child speed and multiplexing that clock around the clock divider into the child domain. This then tests all the logic paths entirely within both domains but does not test the paths between the parent and child domains at speed. A third approach is to apply sufficient clock pulses to the parent domain such that the needed clock pulses are propagated out of the clock divider. In the present state of the art for ATPG (automatic test pattern generation), this increases the sequential depth of the calculations to make this approach not feasible for any divider greater than a divide by 2 or 3 at most. For example if the clock divider in FIG. 7 was a divide by 8 and a broadside test approach was used, 16 clock pulses would be needed at the parent to get the required 2 clock pulses in the child domain. This represents a sequential depth of at least 16 and depending on the mix of memory elements used could be even twice as large. The invention described here can replace the clock divider. Unit(100) enables a method to allow testing of non multi-cycle paths between the parent and child domains at speed by providing an easy means of generating single clock edges. Replacing the clock divider with the CLOCK CONTROL CIRCUIT FOR TEST (100) also enables clock control without adding additional circuitry which alters the clock paths for Functional to test modes.

Figure 8:
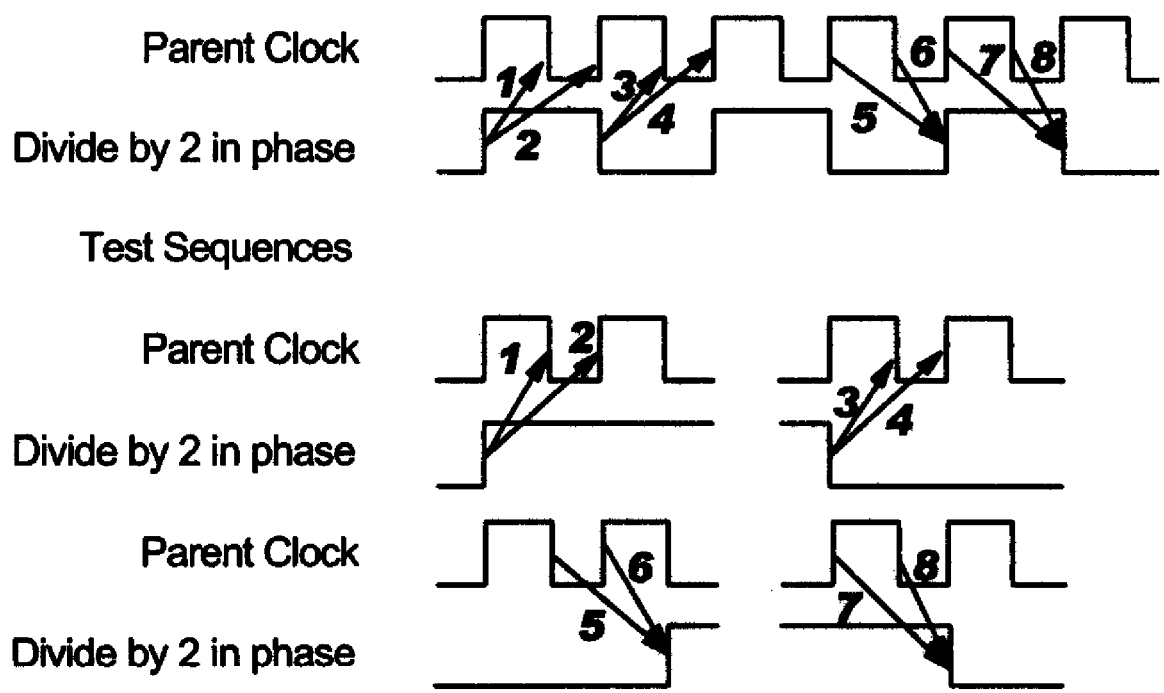
FIG. 8 shows how data flows between the parent and child domains for an in phase divide by 2 clock generator and the edges which be readily generated by the invention for testing these paths.

FIG. 8 shows the at speed data transfers possible between a parent and child domain where a clock divider illustrated in FIG. 7 is an in phase divide by 2. The child domain is the logic being clocked by the divide by 2 output. In the first pair of waveforms of FIG. 8, the arrows represent the non multi-cycle path data flow between parent and child domains. Arrow 1 represents the data being sourced from a positive edge triggered memory element in the child domain and being captured by a negative edge triggered memory element in the parent clock domain. Arrow 2 represents the data being sourced from a positive edge triggered memory element in the child domain and being captured by a positive edge triggered memory element in the parent clock domain. Arrow 3 represents the data being sourced from a negative edge triggered memory element in the child domain and being captured by a negative edge triggered memory element in the parent clock domain. Arrow 4 represents the data being sourced from a negative edge triggered memory element in the child domain and being captured by a positive edge triggered memory element in the parent clock domain. Arrow 5 represents the data being sourced from a positive edge triggered memory element in the parent domain and being captured by a positive edge triggered memory element in the child clock domain. Arrow 6 represents the data being sourced from a negative edge triggered memory element in the parent domain and being captured by a positive edge triggered memory element in the child clock domain. Arrow 7 represents the data being sourced from a positive edge triggered memory element in the parent domain and being captured by a negative edge triggered memory element in the child clock domain. Arrow 8 represents the data being sourced from a negative edge triggered memory element in the parent domain and being captured by a negative edge triggered memory element in the child clock domain.

The next 4 sets of waveforms represent how the paths described above can be tested at speed while the at speed test is proceeding in the parent domain by generating a single clock edge in the child domain. For example a single rising edge in the child domain coincident with the first rising edge in the parent domain tests paths of the type represented by arrows 1 and 2. With 4 edges, all logic paths between the parent and child domain can be tested at speed. To complete the testing of both domains, the parent domain clock would be reset to the frequency of the child domain and the CLOCK CONTROL CIRCUIT FOR TEST would be set to a divide by 1 (all '1's scanned into the shift register 13 in FIG. 3 and all '0's into the shift register 14 in FIG. 3) and the remaining untested paths in the child domain can be easily tested.

Figure 9:
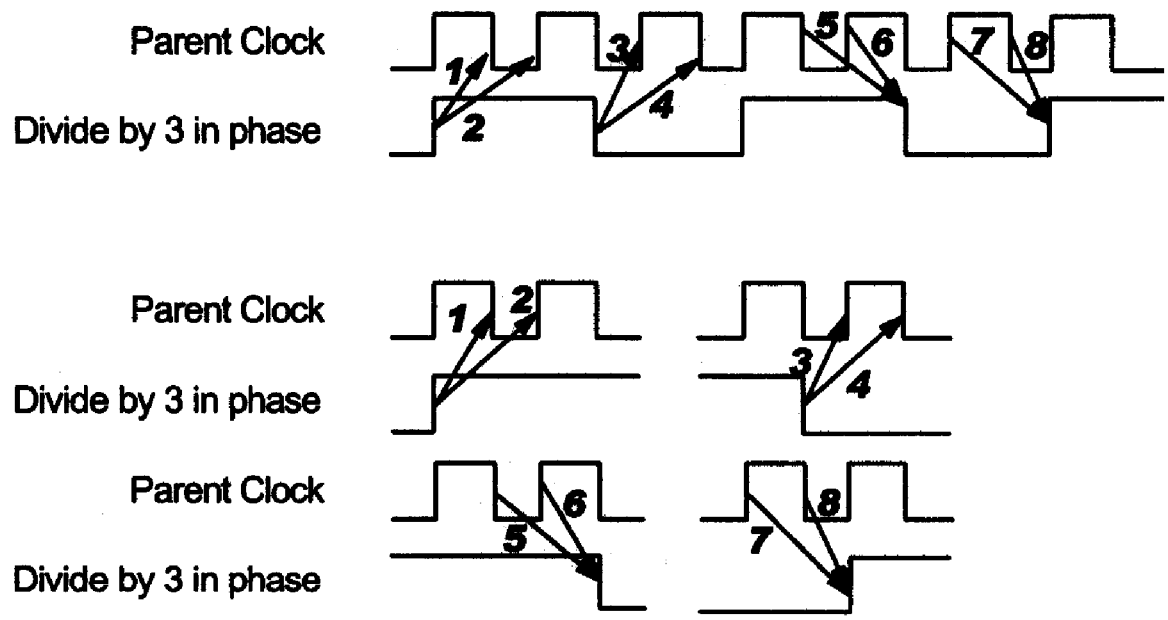
FIG. 9 shows how data flows between the parent and child domains for an in phase divide by 3 clock generator and the edges which may be readily generated by the invention for testing these paths.

FIG. 9 shows the at speed data transfers possible between a parent and child domain where a clock divider illustrated in FIG. 7 is an in phase divide by 3. The child domain is the logic being clocked by the divide by 3 output. In the first pair of waveforms, the arrows represent the non multi-cycle path data flows between parent and child domains. Arrow 1 represents the data being sourced from a positive edge triggered memory element in the child domain and being captured by a negative edge triggered memory element in the parent clock domain. Arrow 2 represents the data being sourced from a positive edge triggered memory element in the child domain and being captured by a positive edge triggered memory element in the parent clock domain. Arrow 3 represents the data being sourced from a negative edge triggered memory element in the child domain and being captured by a positive edge triggered memory element in the parent clock domain. Arrow 4 represents the data being sourced from a negative edge triggered memory element in the child domain and being captured by a negative edge triggered memory element in the parent clock domain. Arrow 5 represents the data being sourced from a negative edge triggered memory element in the parent domain and being captured by a negative edge triggered memory element in the child clock domain. Arrow 6 represents the data being sourced from a positive edge triggered memory element in the parent domain and being captured by a negative edge triggered memory element in the child clock domain. Arrow 7 represents the data being sourced from a positive edge triggered memory element in the parent domain and being captured by a positive edge triggered memory element in the child clock domain. Arrow 8 represents the data being sourced from a negative edge triggered memory element in the parent domain and being captured by a positive edge triggered memory element in the child clock domain.

The next 4 sets of waveforms represent how the paths described above can be tested at speed while the at speed test is proceeding in the parent domain by generating a single clock edge in the child domain. For example a single rising edge in the child domain coincident with the first rising edge in the parent domain tests paths of the type represented by arrows 1 and 2. With 4 edges, all logic paths between the parent and child domain can be tested at speed. To complete the testing of both domains, the parent domain clock would be reset to the frequency of the child domain and the CLOCK CONTROL CIRCUIT FOR TEST would be set to a divide by 1 (all '1's scanned into the shift register 13 in FIG. 3 and all '0's into the shift register 14 in FIG. 3) and the remaining untested paths in the child domain can be easily tested.

Figure 10:
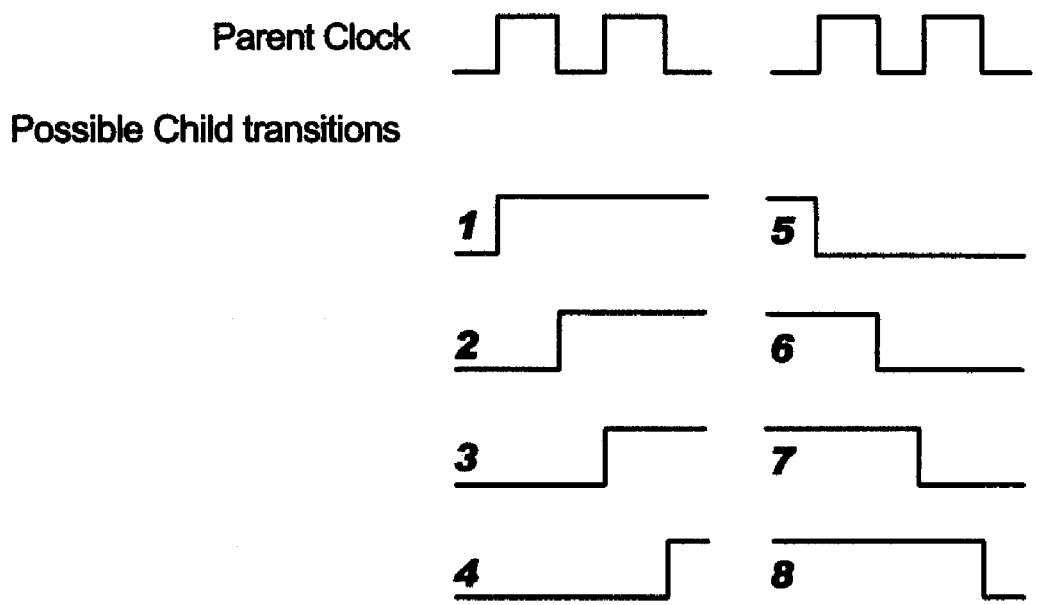
FIG. 10 shows various edges that may be generated with the inventive circuit for testing the paths between synchronous related clock domains.

FIG. 10 illustrates the possible transitions in the child domain by the CLOCK CONTROL CIRCUIT FOR TEST with two clock pulses in the parent domain. Two clock pulses are commonly used in the art for testing in what is known as Abroadside@ or Alaunch of capture@ testing for high speed transitional delay fault testing. With the Abroadside@ clock pattern, the CLOCK CONTROL CIRCUIT FOR TEST can generate 8 different edge configurations. If the data paths are examined for downstream clock dividers as illustrated in FIG. 7, it can be determined that this set of edge transitions is sufficient to test all at speed data paths between the parent and child domains. Which of the 8 edges are required will depend on the in phase or out of phase characteristics of the clock divider and if the clock divider is an odd or even divider. With the clock divider replaced by the CLOCK CONTROL CIRCUIT FOR TEST, this testing is facilitated.

Table 1 in FIG. 11 illustrates which edges are required for testing of at speed paths between parent and child domains for clock divider characteristics of odd or even divider and in or out of phase operation.

While the invention has been described in terms of a single preferred embodiment, those skilled in the art will recognize that the invention can be practiced in various versions within the spirit and scope of the following claims.

What is claimed is:

1. A method of performing a structural at speed test of discrete logic elements within an integrated circuit, wherein the logic elements are synchronized with a plurality of clock domains, the method comprising:
   coupling a clock control circuit for test to a primary clock generator for clock control;
   providing control circuitry within the clock control circuit for test to generate multiple output clock signals for a plurality of functional logic paths within the integrated circuit;
   providing test logic within the clock control circuit for test circuit for the plurality of functional logic paths;
   selecting a data source for a selected one of the plurality of functional logic paths;
   performing an at speed test using an output clock signal via the selected data source; and
   continuing the operation of the primary clock generator during the at speed test,
   wherein the primary clock generator selects the data source which generates the output clock signal.

2. The method according to claim 1, further comprising;
   controlling said clock control circuit for test to alter the frequency of the primary clock generator input to match the frequency of a plurality of downstream clock dividers to facilitate testing a logic path downstream from the primary clock generator.

3. The method according to claim 1, further comprising;
   controlling said clock control circuit for test to release at least two single clock edges to facilitate at speed testing of logic paths corresponding to a plurality of different clock domains.

4. The method according to claim 1, further comprising;
   programming the clock control circuit for test to generate N, where N is a positive, whole number, clock pulses or other waveforms in accordance with a predetermined specification of at speed test parameters.

5. A method according to claim 1, further comprising;
   a design methodology for the clock control circuit for test which relaxes the timing requirements for clock control providing more margin for the design.

6. The method according to claim 1, further comprising a step of storing data specifying at least one set of clock edges to be sent to a receiving clock domain.

7. The method according to claim 6, in which said clock control circuit for test is controlled by data stored in at least one FSM.

8. The method according to claim 7, in which said clock control circuit for test is controlled to pass a set of pulses specified by stored data in one of at least two FSMs.

9. A method of performing a structural at speed test of a plurality of discrete logic elements within an integrated circuit, wherein the logic elements are synchronized with a plurality of clock domains, the method comprising:
replacing one or more of a plurality of child clock dividers with one or more of a plurality of clock control circuits for test.

10. The method according to claim 9, further comprising; controlling said clock control circuit for test to release at least two single clock edges to facilitate at speed testing of logic paths corresponding to a plurality of different clock domains.

11. The method according to claim 9, further comprising; programming the clock control circuit for test to generate N, where N is a positive, whole number, clock pulses or other waveforms in accordance with a predetermined specification of at speed test parameters.

12. The method according to claim 9, further comprising; a design methodology for the clock control circuit for test which relaxes the timing requirements for clock control providing more margin for the design.

13. The method according to claim 9, further comprising a step of storing data specifying at least one set of clock edges to be sent to a receiving clock domain.

14. The method according to claim 13, in which said clock control circuit for test is controlled by data stored in at least one FSM.

15. The method according to claim 14, in which said clock control circuit for test is controlled to pass a set of pulses specified by stored data in one of at least two FSMs.

16. The method of claim 9, wherein the plurality of clock control circuits for test are parents to a second plurality of clock control circuits for test.

17. An apparatus for performing a structural at speed test of discrete logic elements within an integrated circuit, wherein the logic elements are synchronized with a plurality of clock domains, comprising:
a clock control circuit for test coupled to a primary clock generator for clock control;
control circuitry within the clock control circuit for test to generate multiple output clock signals for a plurality of functional logic paths within the integrated circuit;
test logic within the clock control circuit for test circuit for the plurality of functional logic paths;
selection circuitry for selecting a data source for a selected one of the plurality of functional logic paths; and
applying said selected data source to at speed test using an output clock signal while the operation of the primary clock generator continues in operation during the at speed test; and
wherein the primary clock generator selects the data source which generates the output clock signal.

18. The apparatus according to claim 17,
in which said control unit comprises at least a test-only control circuit for controlling a clock during test and a functional control circuit for controlling a clock during functional operation.

19. The apparatus according to claim 18:
in which at least one of said circuits for controlling comprises a FSM.

20. The apparatus according to claim 18:
in which at least one of said circuits for controlling comprises a shift register.

21. The apparatus according to claim 20:
in which at least one of said shift registers is scannable, whereby a desired response may be programmed in test mode.

22. The apparatus according to claim 21:
in which at least one of said shift registers has a MSB stored in a scan only latch, whereby said FSM holds a final value.

23. The apparatus according to claim 17,
in which at least one of said circuits for controlling comprises a FSM.

24. The apparatus according to claim 17:
in which at least one of said circuits for controlling comprises a shift register.

25. apparatus according to claim 24:
in which at least one of said shift registers is scannable, whereby a desired response may be programmed in test mode.

26. The apparatus according to claim 25:
in which at least one of said shift registers has a MSB stored in a scan only latch, whereby said FSM holds a final value.

27. The apparatus according to claim 17,
in which said clock control circuit for test is connected to a clock deskew circuit in which the input clock selects the value stored in at least one storage unit for transmission on the output clock.

28. The apparatus according to claim 27,
in which at least one of said circuits for controlling comprises a FSM.

29. The apparatus according to claim 27:
in which at least one of said circuits for controlling comprises a shift register.

30. The apparatus according to claim 29:
in which at least one of said shift registers is scannable, whereby a desired response may be programmed in test mode.

31. The apparatus according to claim 30:
in which at least one of said shift registers has a MSB stored in a scan only latch, whereby said FSM holds a final value.

32. The apparatus according to claim 30:
in which at least one of said shift registers has a MSB stored in a scan only latch, whereby said FSM holds a final value.

33. The apparatus according to claim 17:
in which said clock control circuit for test contains a stored value for each phase of said output clock.

34. The apparatus according to claim 33,
in which said control unit comprises at least a test-only control circuit for controlling a clock during test and a functional control circuit for controlling a clock during functional operation.

35. The apparatus according to claim 34:
in which at least one of said circuits for controlling comprises a FSM.

36. The apparatus according to claim 34:
in which at least one of said circuits for controlling comprises a shift register.

37. The apparatus according to claim 36:
in which at least one of said shift registers is scannable, whereby a desired response may be programmed in test mode.

* * * * *